(12) United States Patent
Nishide et al.

(10) Patent No.: US 12,456,634 B2
(45) Date of Patent: *Oct. 28, 2025

(54) SUBSTRATE PROCESSING APPARATUS

(71) Applicant: SCREEN Holdings Co., Ltd., Kyoto (JP)

(72) Inventors: Hajime Nishide, Kyoto (JP); Kwichang Kang, Kyoto (JP); Takao Matsumoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/420,454

(22) Filed: Jan. 23, 2024

(65) Prior Publication Data

US 2024/0194497 A1 Jun. 13, 2024

Related U.S. Application Data

(63) Continuation of application No. 17/270,964, filed as application No. PCT/JP2019/032884 on Aug. 22, 2019, now Pat. No. 11,915,945.

(30) Foreign Application Priority Data

Sep. 21, 2018 (JP) .................................. 2018-177591

(51) Int. Cl.
*H01L 21/67* (2006.01)
*B01D 46/00* (2022.01)
(Continued)

(52) U.S. Cl.
CPC .... *H01L 21/67051* (2013.01); *B01D 46/0041* (2013.01); *B08B 15/02* (2013.01);
(Continued)

(58) Field of Classification Search
CPC ............... H01L 21/6719; H01L 21/304; H01L 21/67178; H01L 21/67051; H01L 21/67017; B01D 46/0041; B08B 15/02
See application file for complete search history.

(56) References Cited

U.S. PATENT DOCUMENTS

| 10,056,269 B2 | 8/2018 | Minamida |
| 11,915,945 B2 * | 2/2024 | Nishide ............. H01L 21/67051 |

(Continued)

FOREIGN PATENT DOCUMENTS

| CN | 1676231 A | 10/2005 |
| JP | 2000-114229 A | 4/2000 |

(Continued)

OTHER PUBLICATIONS

Decision to Grant a Patent dated Sep. 19, 2024 for corresponding Japanese Patent Application No. 2023-200001 with English translation.

(Continued)

*Primary Examiner* — Benjamin L Osterhout
(74) *Attorney, Agent, or Firm* — OSTROLENK FABER LLP

(57) ABSTRACT

In a substrate processing apparatus (1), above a plurality of processing parts (31) arrayed in an up-and-down direction, arranged are a plurality of collecting pipes (61*a* to 61*c*). The plurality of collecting pipes (61*a* to 61*c*) correspond to a plurality of fluid classifications, respectively. Further, provided are a plurality of exhaust pipes (4) extending upward from the plurality of processing parts (31), into which exhaust gases from the processing parts (31) flow, respectively. At an upper end portion of each of the exhaust pipes (4), provided is a flow path switching part (5) which connects the upper end portion to the plurality of collecting pipes (61*a* to 61*c*) and switches a flow path of the exhaust (Continued)

gas flowing in the exhaust pipe (4) among the plurality of collecting pipes (61*a* to 61*c*).

20 Claims, 8 Drawing Sheets

(51) Int. Cl.
    *B08B 15/02*     (2006.01)
    *H01L 21/304*     (2006.01)

(52) U.S. Cl.
    CPC .... *H01L 21/67178* (2013.01); *H01L 21/6719* (2013.01); *H01L 21/304* (2013.01); *H01L 21/67017* (2013.01)

(56) References Cited

U.S. PATENT DOCUMENTS

| | | |
|---|---|---|
| 2003/0121173 A1 | 7/2003 | Bae |
| 2011/0209560 A1 | 9/2011 | Ito |
| 2011/0308626 A1 | 12/2011 | Ogata et al. |
| 2012/0160279 A1 | 6/2012 | Konishi et al. |
| 2012/0227768 A1 | 9/2012 | Morita et al. |
| 2015/0228518 A1 | 8/2015 | Hyon |
| 2015/0314338 A1 | 11/2015 | Morioka et al. |
| 2016/0124438 A1 | 5/2016 | Minamida et al. |
| 2016/0126112 A1 | 5/2016 | Minamida et al. |
| 2018/0061688 A1 | 3/2018 | Minamida |
| 2019/0201949 A1 | 7/2019 | Okita et al. |
| 2019/0293353 A1 | 9/2019 | Shiba |

FOREIGN PATENT DOCUMENTS

| | | | |
|---|---|---|---|
| JP | 2006-019584 A | 1/2006 | |
| JP | 2006-229262 A | 8/2006 | |
| JP | 2007-049093 A | 2/2007 | |
| JP | 2009-252884 A | 10/2009 | |
| JP | 2012-009511 A | 1/2012 | |
| JP | 2012-190823 A | 10/2012 | |
| JP | 2013-089689 A | 5/2013 | |
| JP | 2014-197592 A | 10/2014 | |
| JP | 2016-072383 A | 5/2016 | |
| JP | 2016-072480 A | 5/2016 | |
| JP | 2016-092143 A | 5/2016 | |
| JP | 2018-046272 A | 3/2018 | |
| TW | 201413780 A | 4/2014 | |
| TW | 201631649 A | 9/2016 | |
| WO | WO 2014/103523 A1 | 7/2014 | |

OTHER PUBLICATIONS

Office Action dated Jul. 8, 2024 issued in corresponding Chinese Patent Application No. 201980061111.4 with its English translation.
International Search Report mailed Oct. 8, 2019 in corresponding PCT International Application No. PCT/JP2019/032884.
Written Opinion mailed Oct. 8, 2019 in corresponding PCT International Application No. PCT/W2019/032884.
Decision to Grant a Patent for Japanese Patent Application No. 2022-208189 issued on Oct. 30, 2023. Machine translation attached.
Decision to Grant a Patent issued May 24, 2022 in corresponding Taiwanese Application No. 110144309.
Decision to Grant a Patent dated Aug. 30, 2021 in corresponding Taiwanese Application No. 110102660.
PCT/IB/326—Notification Concerning Transmittal of International Preliminary Report on Patentability including PCT/IB/373 and PCT/ISA/237 (in Japanese) mailed Apr. 1, 2021 for International Application No. PCT/JP2019/032884.
PCT/IB/338—Notification of Transmittal of Translation of the International Preliminary Report on Patentability including PCT/IB/373 and PCT/ISA/237 (in English) mailed Apr. 1, 2021 for International Application No. PCT/JP2019/032884.
Office Action dated Sep. 6, 2024 issued in corresponding Korean Patent Application No. 10-2024-7027223 with its English machine translation.

* cited by examiner

SUBSTRATE PROCESSING APPARATUS

CROSS-REFERENCE TO RELATED APPLICATIONS

The present application is a continuation of U.S. patent application Ser. No. 17/270,964, filed Feb. 24, 2021, which is national stage application of PCT Application No. PCT/JP2019/032884, filed Aug. 22, 2019, which claims priority to Japanese Application No. 2018-177591, filed Sep. 21, 2018, the contents of which applications are incorporated by reference.

TECHNICAL FIELD

The present invention relates to a substrate processing apparatus.

BACKGROUND ART

In a process of manufacturing a semiconductor device, conventionally, a substrate processing apparatus has been used, which performs processings on a semiconductor substrate (hereinafter, referred to simply as a "substrate") by using various types of processing fluids. Further, Japanese Patent Application Laid-Open No. 2016-72480 (Document 1) discloses an exhaust switching apparatus for switching an outlet destination of exhaust gas discharged from a substrate processing apparatus in accordance with the kind of processing fluid, among three exhaust apparatuses. In Document 1, the substrate processing apparatus is provided in a clean room, and the exhaust switching apparatus is provided in a downstairs space of the clean room, which is termed a subfab. By providing the exhaust switching apparatus, it becomes possible to reduce environmental load. Furthermore, WO 2014/103523 discloses an exhaust switching apparatus in which exhaust switching units corresponding to a plurality of processing chambers are incorporated in a multistage state, and shows that the exhaust switching apparatus is made movable by attaching casters thereto and the exhaust switching apparatus is fixed to a floor of an installation location by bolts.

In a case where the exhaust switching apparatus is disposed in the subfab, like in the case described in Document 1, since the length of an exhaust pipe connecting from a processing part of the substrate processing apparatus to the exhaust switching apparatus becomes longer, a pressure loss in the exhaust pipe disadvantageously increases. Though there is a possible case where the exhaust switching apparatus is disposed at the side of the processing part, to thereby reduce the length of the exhaust pipe, the footprint of the substrate processing apparatus on the whole disadvantageously increases.

SUMMARY OF INVENTION

The present invention is intended for a substrate processing apparatus, and it is an object of the present invention to reduce a pressure loss in an exhaust pipe and reduce a footprint of the substrate processing apparatus.

The substrate processing apparatus according to the present invention includes a plurality of processing parts arrayed in an up-and-down direction, each of which is capable of supplying a plurality of kinds of processing fluids to a substrate, a plurality of exhaust pipes extending upward from the plurality of processing parts, into which exhaust gases from the plurality of processing parts flow, respectively, two or more collecting pipes arranged above the plurality of processing parts, the two or more collecting pipes corresponding to two or more fluid classifications, respectively, into which the plurality of kinds of processing fluids are classified, a plurality of flow path switching parts each of which is provided at an upper end portion of one exhaust pipe, connects the upper end portion to the two or more collecting pipes, and switches a flow path of exhaust gas flowing in the exhaust pipe, among the two or more collecting pipes, and a control part for controlling the plurality of flow path switching parts in accordance with the processing fluids used in the plurality of processing parts.

According to the present invention, it is possible to reduce a pressure loss in the exhaust pipe and reduce a footprint of the substrate processing apparatus.

In one preferred embodiment of the present invention, the two or more collecting pipes overlap the plurality of processing parts in the up-and-down direction.

In another preferred embodiment of the present invention, the substrate processing apparatus further includes a support frame for supporting the plurality of processing parts, and in the substrate processing apparatus, the two or more collecting pipes are fixed to the support frame.

In still another preferred embodiment of the present invention, the two or more collecting pipes extend in a longitudinal direction substantially perpendicular to the up-and-down direction, and the substrate processing apparatus, in which a set of the plurality of processing parts, the plurality of exhaust pipes, and the plurality of flow path switching parts is assumed as a multilayer unit, further includes another multilayer unit having the same constitution as that of the multilayer unit and being positioned in the longitudinal direction with respect to the multilayer unit.

In yet another preferred embodiment of the present invention, each exhaust pipe includes a first exhaust path extending upward from a processing part; and a second exhaust path having a portion extending from an upper end of the first exhaust path toward a direction substantially perpendicular to the up-and-down direction and being connected to a flow path switching part, respective upper ends of a plurality of first exhaust paths in the plurality of exhaust pipes are disposed approximate to one another, respective lengths of the plurality of first exhaust paths are different from one another, respective lengths of a plurality of second exhaust paths in the plurality of exhaust pipes are different from one another, and in each combination of two exhaust pipes included in the plurality of exhaust pipes, the length of the first exhaust path in one exhaust pipe is longer than that of the first exhaust path in the other exhaust pipe and the length of the second exhaust path in the one exhaust pipe is shorter than that of the second exhaust path in the other exhaust pipe.

In a further preferred embodiment of the present invention, each processing part is connected to an exhaust pipe extending in the up-and-down direction through a long hole extending in the up-and-down direction.

In a still further preferred embodiment of the present invention, the substrate processing apparatus further includes a plurality of liquid jet parts for jetting a predetermined liquid into the plurality of exhaust pipes, respectively, and a plurality of drain pipes extending downward from respective lower end portions of the plurality of exhaust pipes.

In a yet further preferred embodiment of the present invention, the substrate processing apparatus further includes a plurality of pressure adjustment parts provided in the plurality of exhaust pipes, respectively, and in the substrate processing apparatus, each pressure adjustment part includes a pressure sensor for measuring pressure in an exhaust pipe and a flow rate adjustment mechanism for adjusting a flow rate of the exhaust gas flowing in the exhaust pipe on the basis of a measured value of the pressure sensor.

In another further preferred embodiment of the present invention, each pressure adjustment part is disposed in a region adjacent to an exhaust outlet of a processing part.

In still another further preferred embodiment of the present invention, the substrate processing apparatus further includes a plurality of outside air introduction parts each of which is connected to the two or more collecting pipes, the plurality of outside air introduction parts corresponding to the plurality of flow path switching parts, respectively, and in the substrate processing apparatus, an outside air introduction part corresponding to each flow path switching part introduces outside air into a collecting pipe(s) other than the collecting pipe selected as the flow path of exhaust gas by the each flow path switching part.

In this case, it is preferable that each outside air introduction part should have a shutter for changing an opening area of an outside air introduction port communicating with the two or more collecting pipes.

These and other objects, features, aspects and advantages of the present invention will become more apparent from the following detailed description of the present invention when taken in conjunction with the accompanying drawings.

DESCRIPTION OF EMBODIMENTS

Figure 1:
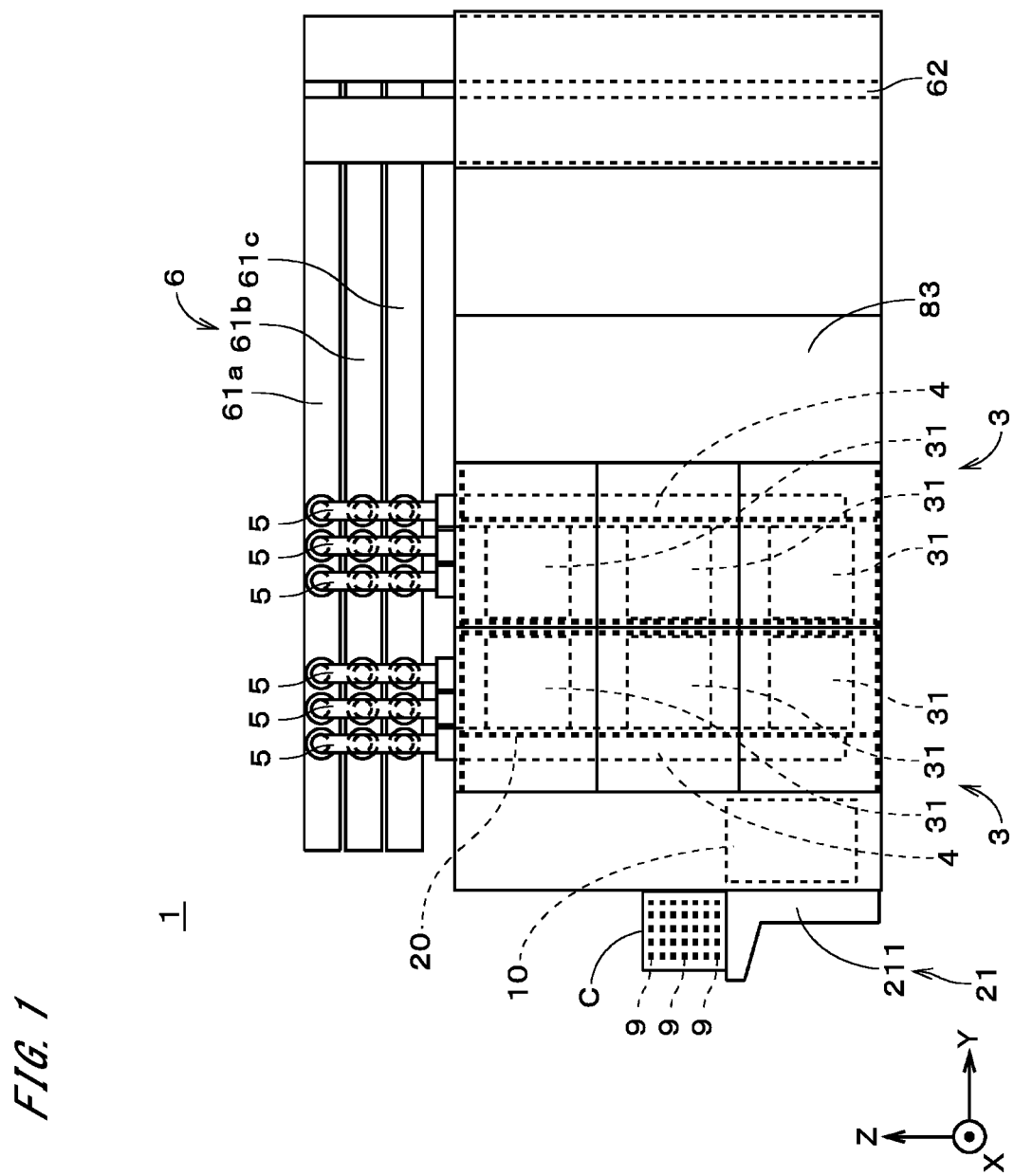
FIG. 1 is a view showing an appearance of a substrate processing apparatus.

FIG. 1 is a view showing an appearance of a substrate processing apparatus 1 in accordance with one preferred embodiment of the present invention. The substrate processing apparatus 1 is a single-substrate processing apparatus for processing substrates 9 one by one by a processing part 31 described later. In FIG. 1, three directions orthogonal to one another are shown as an X direction, a Y direction, and a Z direction. Typically, the Z direction is an up-and-down direction (vertical direction) and the X direction and the Y direction are horizontal directions.

Figure 2:
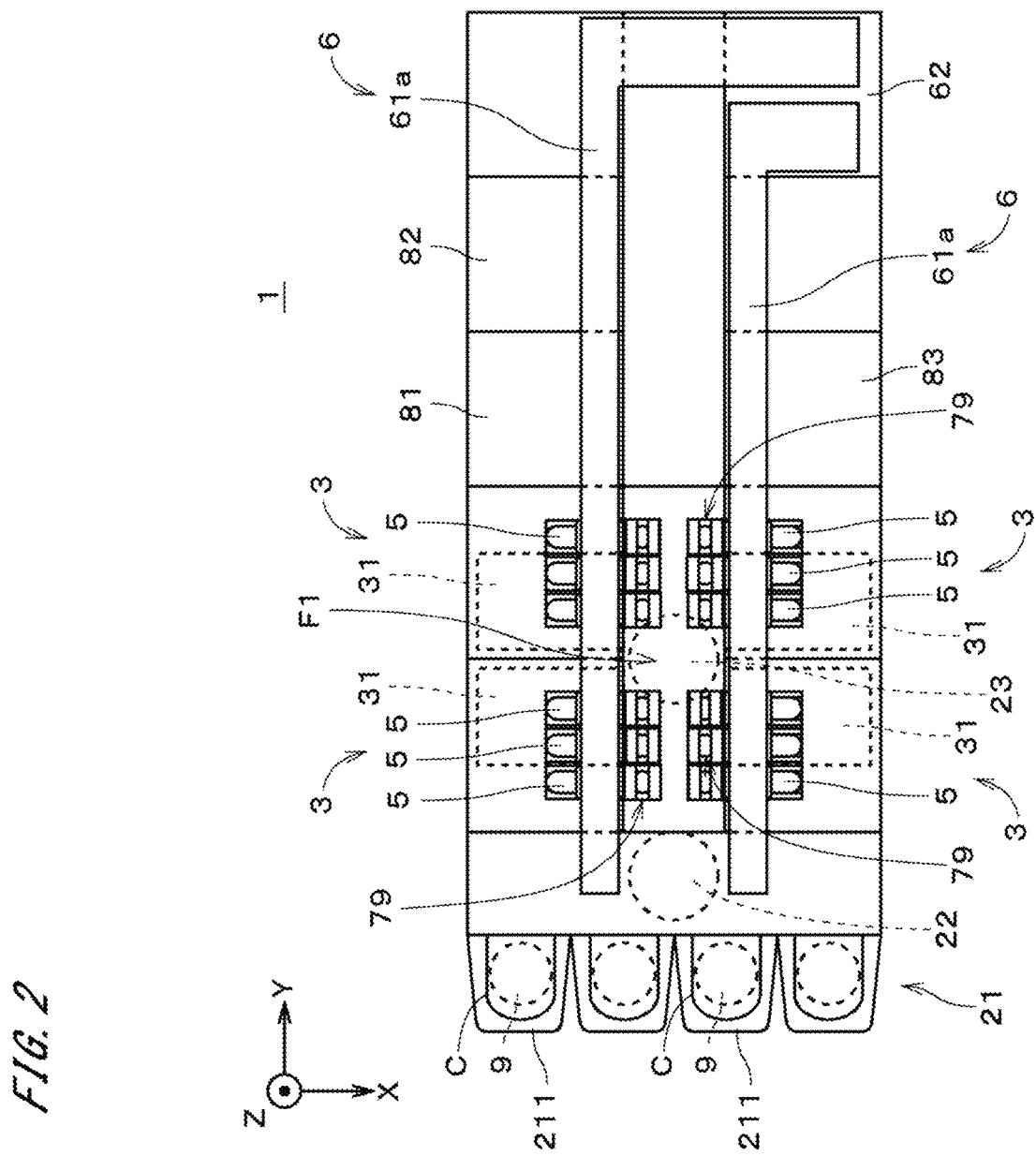
FIG. 2 is a plan view showing the substrate processing apparatus.

FIG. 2 is a plan view showing the substrate processing apparatus 1 as viewed from the (+Z) side toward the (−Z) direction. As shown in FIGS. 1 and 2, the substrate processing apparatus 1 includes a control part 10, a support frame 20, a container mounting part 21, an indexer robot 22, a center robot 23, a plurality of multilayer units 3, and a plurality of collecting pipe groups 6. The control part 10 performs a general control of the substrate processing apparatus 1.

As shown in FIG. 2, the container mounting part 21 is provided at an end portion of the substrate processing apparatus 1 on the (−Y) side, and has a plurality of container rest tables 211. The plurality of container rest tables 211 are aligned in the X direction. On each of the container rest tables 211, placed is a storage container C for accommodating a plurality of substrates 9 therein. The storage container C is a carrier for accommodating the plurality of substrates 9 therein in a multistage. The indexer robot 22 is disposed in the vicinity of the container mounting part 21. The indexer robot 22 performs unloading of an unprocessed substrate 9 from the storage container C and loading of a processed substrate 9 into the storage container C. Further, the indexer robot 22 passes the substrate 9 to/from the center robot 23. The center robot 23 is disposed substantially at the center in the X direction on the (+Y) side of the indexer robot 22. The center robot 23 performs loading of the unprocessed substrate 9 received from the indexer robot 22 into the processing part 31 described later. Furthermore, the center robot 23 performs unloading of the processed substrate 9 from the processing part 31 and passes the substrate 9 to the indexer robot 22.

The plurality of multilayer units 3 are disposed around the center robot 23. In the exemplary case of FIG. 2, two multilayer units 3 are aligned in the Y direction on the (+X) side of the center robot 23 and two multilayer units 3 are aligned in the Y direction on the (−X) side of the center robot 23. As shown in FIG. 1, each of the multilayer units 3 includes a plurality of processing parts 31. The plurality of processing parts 31 are arrayed in the up-and-down direction. In the present preferred embodiment, each multilayer unit 3 has three processing parts 31. The number of processing parts 31 in each multilayer unit 3 may be two or four or more. The support frame 20 is a support body for supporting a main structure of the substrate processing apparatus 1. In FIG. 1, part of the support frame 20 is represented by a heavy broken line. The processing parts 31 in the plurality of multilayer units 3 are attached to the support frame 20 by bolts or the like and supported by the support frame 20.

In FIGS. 1 and 2, an outer shape of a processing chamber in each processing part 31 is represented by a broken-line rectangle. In the processing part 31, inside the processing chamber, provided are a substrate holding part, a nozzle part, and the like. In the processing part 31, a plurality of kinds of processing fluids can be supplied through the nozzle part to the substrate 9 held by the substrate holding part. In a case where the processing fluid is liquid, for example, a substrate rotating part for rotating the substrate holding part and a cup part surrounding the substrate holding part are further provided, and the processing fluid supplied onto the rotating substrate 9 is received and collected by the cup part. Further, a fan filter unit (FFU) is provided above the processing chamber, and airflow going downward is formed inside the processing chamber. The processing fluids used in the processing part 31 are classified into a plurality of fluid classifications. In the present preferred embodiment, the plurality of fluid classifications include an acid chemical liquid, an alkaline chemical liquid, and an organic solvent. The processing fluid may be gas.

As the acid chemical liquid, for example, used is DHF (dilute hydrofluoric acid), SC2 (hydrochloric acid hydrogen peroxide mixture), BHF (buffered hydrofluoric acid), sulfuric acid, SPM (sulfuric acid hydrogen peroxide mixture), nitrate fluoride (mixture of hydrofluoric acid and nitric acid), or the like. As the alkaline chemical liquid, for example, used is SC1 (ammonia hydrogen peroxide mixture), aqueous ammonia, ammonium fluoride solution, TMAH (tetramethylammonium hydroxide), or the like. As the organic solvent, used is IPA (isopropyl alcohol), methanol, ethanol, HFE (hydrofluoroether), acetone, or the like. The organic solvent may be a mixture, and for example, a mixture of IPA and acetone, a mixture of IPA and methanol, or the like is used.

As shown in FIG. 2, in the substrate processing apparatus 1, also provided are an acid chemical supply unit 81, an alkaline chemical supply unit 82, and an organic solvent supply unit 83. The acid chemical supply unit 81, the alkaline chemical supply unit 82, and the organic solvent supply unit 83 are arranged on the (+Y) side of the plurality of multilayer units 3. The acid chemical supply unit 81 stores the acid chemical liquid therein and supplies the acid chemical liquid to the nozzle part of the processing part 31. The alkaline chemical supply unit 82 stores the alkaline chemical liquid therein and supplies the alkaline chemical liquid to the nozzle part of the processing part 31. The organic solvent supply unit 83 stores the organic solvent therein and supplies the organic solvent to the nozzle part of the processing part 31.

The plurality of collecting pipe groups 6 are disposed above the plurality of multilayer units 3. As shown in FIG. 1, each collecting pipe group 6 includes a plurality of collecting pipes 61a, 61b, and 61c. The plurality of collecting pipes 61a to 61c included in each collecting pipe group 6 extend in a direction (the Y direction in FIG. 1 and hereinafter, referred to as a "longitudinal direction") substantially perpendicular to the up-and-down direction while being stacked in the up-and-down direction. In the present preferred embodiment, the sectional shape of each of the collecting pipes 61a to 61c perpendicular to the longitudinal direction is a rectangle (see FIG. 3 described later). The sectional shape of each of the collecting pipes 61a to 61c may be any other shape. The plurality of collecting pipes 61a to 61c are fixed to the support frame 20 through a not-shown member.

In the exemplary case shown in FIGS. 1 and 2, two collecting pipe groups 6 are provided and each of the collecting pipe groups 6 includes three collecting pipes 61a to 61c. Further, each collecting pipe group 6 is disposed above the two multilayer units 3 aligned in the longitudinal direction, and each of the processing parts 31 included in the two multilayer units 3 is connected to the three collecting pipes 61a to 61c in the collecting pipe group 6 through the exhaust pipe 4 or the like described later. The three collecting pipes 61a to 61c in the collecting pipe group 6 overlap the plurality of processing parts 31 included in the two multilayer units 3 in the up-and-down direction. Specifically, in the case where the substrate processing apparatus 1 is planarly viewed as shown in FIG. 2, the three collecting pipes 61a to 61c overlap the plurality of processing parts 31. In the substrate processing apparatus 1, the fan filter unit (FFU) F1 is provided above the center robot 23, and since the plurality of collecting pipes 61a to 61c overlap the plurality of processing parts 31 in the up-and-down direction, this prevents the intake of air in the fan filter unit F1 from being blocked by the collecting pipes 61a to 61c.

The plurality of collecting pipes 61a to 61c included in each collecting pipe group 6 correspond to the plurality of already-described fluid classifications, respectively. In the present preferred embodiment, among the plurality of collecting pipes 61a to 61c which are stacked in the up-and-down direction, the uppermost collecting pipe 61a corresponds to the acid chemical liquid. Specifically, when the acid chemical liquid is used in the processing part 31, the uppermost collecting pipe 61a is used as a drain line of gas (hereinafter, referred to as "acid exhaust") discharged from the processing part 31. The acid exhaust contains, for example, gas and mist generated from the acid chemical liquid. Similarly, when the alkaline chemical liquid is used in the processing part 31, the lowermost collecting pipe 61c is used as a drain line of gas (hereinafter, referred to as "alkaline exhaust") discharged from the processing part 31. The alkaline exhaust contains, for example, gas and mist generated from the alkaline chemical liquid. Further, when the organic solvent is used in the processing part 31, the middle collecting pipe 61b is used as a drain line of gas (hereinafter, referred to as "organic exhaust") discharged from the processing part 31. The organic exhaust contains, for example, gas and mist generated from the organic solvent.

As shown in FIG. 2, end portions of the plurality of collecting pipes 61a to 61c on the (+Y) side are connected to an exhaust unit 62. In the exhaust unit 62, provided are a plurality of exhaust paths extending in the up-and-down direction, and the plurality of collecting pipes 61a to 61c are connected to upper ends of the plurality of exhaust paths, respectively. Lower ends of the exhaust paths are connected to a factory plumbing. The factory plumbing is decompressed to almost a constant pressure. The acid exhaust, the alkaline exhaust, and the organic exhaust are guided through the factory plumbing to individual exhaust facilities and appropriately treated. Depending on the layout of the factory plumbing, each of the collecting pipes 61a to 61c may be connected to the factory plumbing through the exhaust path extending upward from the collecting pipe 61a, 61b, or 61c.

Figure 3:
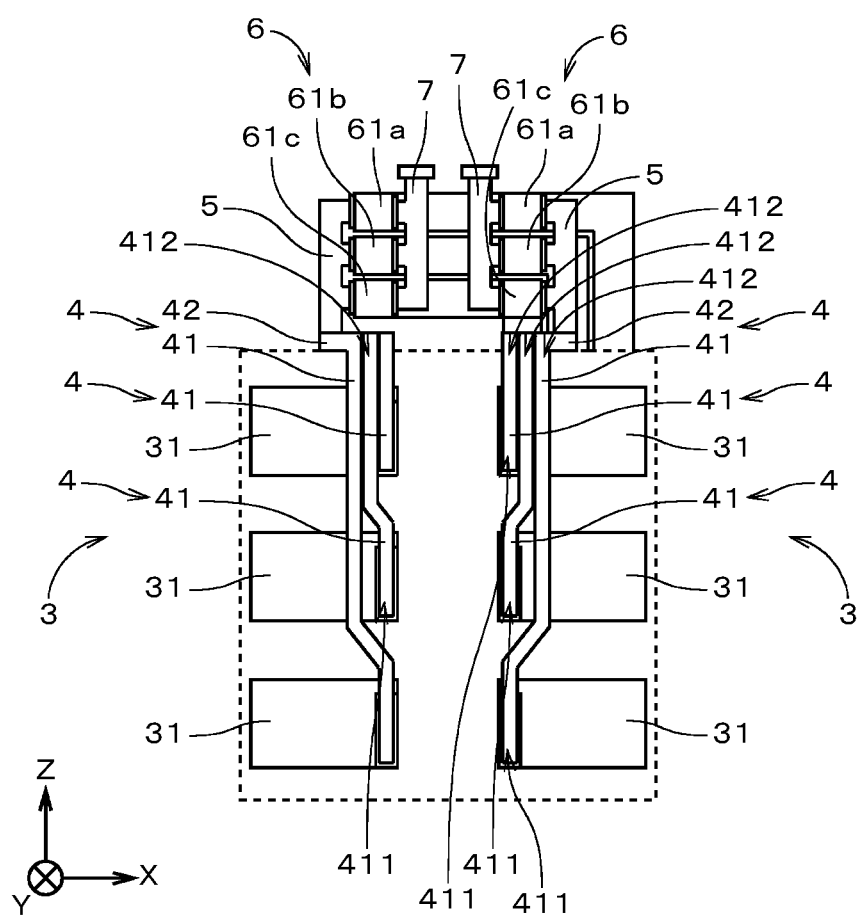
FIG. 3 is a view showing multilayer units.

FIG. 3 is view showing the multilayer units 3 as viewed from the (−Y) side toward the (+Y) direction. Each multilayer unit 3 includes a plurality of exhaust pipes 4, a plurality of flow path switching parts 5, and a plurality of outside air introduction parts 7, besides the plurality of processing parts 31. The plurality of exhaust pipes 4 are connected to the plurality of processing parts 31, respectively. Each exhaust pipe 4 is a flow path into which the acid exhaust, the alkaline exhaust, and the organic exhaust (hereinafter, referred to as "exhaust gas") discharged from the processing part 31 flow. Further, a processing liquid (including the acid chemical liquid, the alkaline chemical liquid, and the organic solvent) used in the processing part 31 is discharged through a not-shown drain line.

As shown in FIG. 3, each exhaust pipe 4 includes a first exhaust path 41 and a second exhaust path 42. The first exhaust path 41 extends in the up-and-down direction, and a lower end 411 of the first exhaust path 41 is connected to the processing part 31. The lower end 411 of the first exhaust path 41 is a lower end portion of the exhaust pipe 4 and hereinafter, referred to as a "lower end portion 411". In the vicinity of the lower end portion 411 of the first exhaust pipe 4, provided are a pressure adjustment part 46 and the like (see FIG. 6) described later. An upper end 412 of the first exhaust path 41 is positioned upper than the processing part 31. To the upper end 412 of the first exhaust path 41, the second exhaust path 42 is connected.

As described earlier, in each multilayer unit 3, the plurality of processing parts 31 are stacked in the up-and-down direction, and in a plurality of first exhaust paths 41 connected to the plurality of processing part 31, respectively, respective positions of the lower end portions 411 in the up-and-down direction are different from one another. On the other hand, in the plurality of first exhaust paths 41, respective positions of the upper ends 412 in the up-and-down direction are the same. Therefore, respective lengths of the plurality of first exhaust paths 41 are different from one another. Among the plurality of first exhaust paths 41, the length of the first exhaust path 41 connected to the processing part 31 which is disposed on the lowermost side is maximum, and the length of the first exhaust path 41 connected to the processing part 31 which is disposed on the uppermost side is minimum. In the exemplary case of FIG. 3 where three processing parts 31 are stacked in the up-and-down direction, the length of the first exhaust path 41 connected to the lower-stage processing part 31 is longer than that of the first exhaust path 41 connected to the middle-stage processing part 31, and the length of the first exhaust path 41 connected to the middle-stage processing part 31 is longer than that of the first exhaust path 41 connected to the upper-stage processing part 31.

Further, in each multilayer unit 3, respective relative positions of the lower end portions 411 of the first exhaust paths 41 with respect to the processing parts 31 are the same among the plurality of first exhaust paths 41. Specifically, on a side surface of the processing part 31 oriented toward the Y direction, the lower end portion 411 is attached to an end portion thereof in the X direction. Furthermore, the first exhaust path 41 connected to the middle-stage processing part 31 and the first exhaust path 41 connected to the lower-stage processing part 31 are provided with respective portions extending in a direction inclined with respect to the up-and-down direction so that the respective upper ends 412 of the plurality of first exhaust paths 41 may be aligned in the X direction while being approximate to one another.

Figure 4:
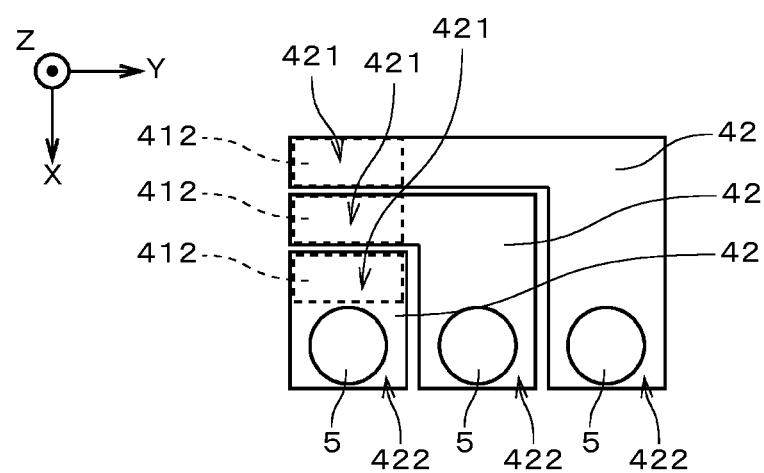
FIG. 4 is a plan view showing a second exhaust path.

FIG. 4 is a plan view showing the plurality of second exhaust paths 42 in the multilayer unit 3 on the (+X) side in FIG. 3. Each second exhaust path 42 includes a first connection end portion 421 and a second connection end portion 422. The first connection end portion 421 and the second connection end portion 422 are both end portions of the second exhaust path 42.

The respective first connection end portions 421 of the plurality of second exhaust paths 42 are aligned in the X direction, and to the plurality of first connection end portions 421, the respective upper ends 412 of the plurality of first exhaust paths 41 are connected, respectively. As shown in FIGS. 3 and 4, to the first connection end portion 421 on the most (−X) side, the upper end 412 of the first exhaust path 41 connected to the upper-stage processing part 31 is connected, and the first connection end portion 421 is connected to the upper-stage processing part 31 through the first exhaust path 41. Thus, the first connection end portion 421 on the most (−X) side and the second exhaust path 42 having the first connection end portion 421 correspond to the upper-stage processing part 31. Similarly, to the first connection end portion 421 adjacent to the above first connection end portion 421 on the most (+X) side, the upper end 412 of the first exhaust path 41 connected to the middle-stage processing part 31 is connected, and the first connection end portion 421 and the second exhaust path 42 having the first connection end portion 421 correspond to the middle-stage processing part 31. Further, to the first connection end portion 421 on the most (+X) side, the upper end 412 of the first exhaust path 41 connected to the lower-stage processing part 31 is connected, and the first connection end portion 421 and the second exhaust path 42 having the first connection end portion 421 correspond to the lower-stage processing part 31.

The respective second connection end portions 422 of the plurality of second exhaust paths 42 are aligned along the longitudinal direction (Y direction) of the collecting pipes 61a to 61c, and to the plurality of second connection end portions 422, the plurality of flow path switching parts 5 are connected, respectively. In the second exhaust path 42 of which the first connection end portion 421 is disposed on the most (+X) side, i.e., the second exhaust path 42 corresponding to the lower-stage processing part 31, a path from the first connection end portion 421 to the second connection end portion 422 extends only in the X direction. In the other two second exhaust paths 42, i.e., the second exhaust path 42 corresponding to the middle-stage processing part 31 and the second exhaust path 42 corresponding to the upper-stage processing part 31, respective paths from the first connection end portion 421 to the second connection end portion 422 each have an L shape having a portion extending in the Y direction and another portion extending in the X direction. The lengths of the above paths in the plurality of second exhaust paths 42 are different from one another. Specifically, the length of the second exhaust path 42 corresponding to the upper-stage processing part 31 is longer than that of the second exhaust path 42 corresponding to the middle-stage processing part 31, and the length of the second exhaust path 42 corresponding to the middle-stage processing part 31 is longer than that of the second exhaust path 42 corresponding to the lower-stage processing part 31. Further, the shape of the second exhaust path 42 in FIG. 4 is only one example, and the second exhaust path 42 may have any other shape having a portion extending in a direction substantially perpendicular to the up-and-down direction from the upper end of the first exhaust path 41.

As described earlier, in the plurality of exhaust pipes 4 included in each multilayer unit 3, among the plurality of first exhaust paths 41, the length of the first exhaust path 41 corresponding to the upper-stage processing part 31 is minimum and the length of the first exhaust path 41 corresponding to the lower-stage processing part 31 is maximum. Further, among the plurality of second exhaust paths 42, the length of the second exhaust path 42 corresponding to the upper-stage processing part 31 is maximum and the length of the second exhaust path 42 corresponding to the lower-stage processing part 31 is minimum. Therefore, in each combination of two exhaust pipes 4 included in the plurality of exhaust pipes 4, the length of the first exhaust path 41 in one exhaust pipe 4 is longer than that of the first exhaust path 41 in the other exhaust pipe 4, and the length of the second exhaust path 42 in the one exhaust pipe 4 is shorter than that of the second exhaust path 42 in the other exhaust pipe 4. Further, depending on the design of the substrate processing apparatus 1, the above-described relation in each combination of two exhaust pipes 4 may not be satisfied.

Figure 5:
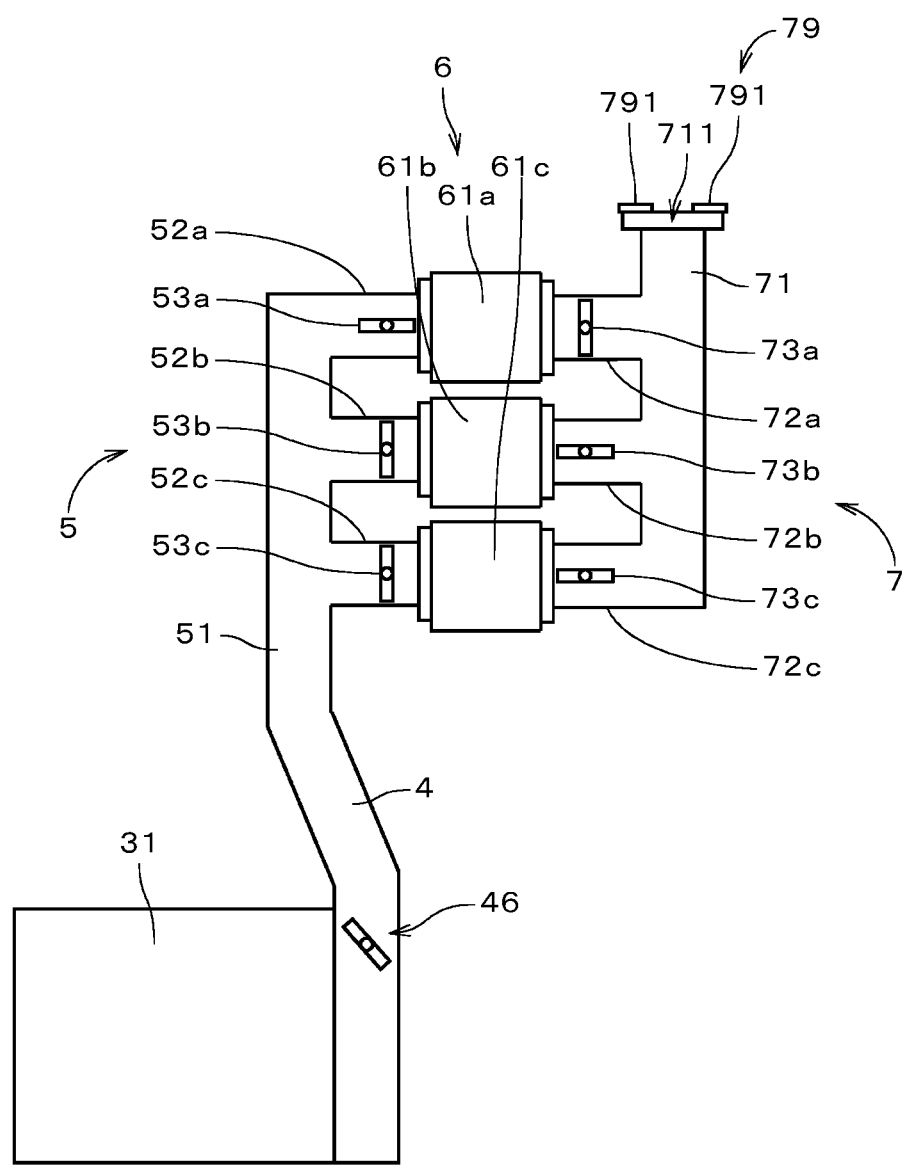
FIG. 5 is a view showing an internal configuration of a flow path switching part and an outside air introduction part.

FIG. 5 is a view schematically showing an internal configuration of the flow path switching part 5 and the outside air introduction part 7. FIG. 5 also shows the pressure adjustment part 46 described later. As described earlier, the flow path switching part 5 is attached to the second exhaust path 42 (see FIG. 4) which is the upper end portion of the exhaust pipe 4 and connected to one processing part 31 through the exhaust pipe 4. The flow path switching part 5 includes a branch pipe 51 and a plurality of exhaust on-off valves 53a, 53b, and 53c. One end of the branch pipe 51 is connected to the exhaust pipe 4. The other end of the branch pipe 51 branches into a plurality of branch paths 52a, 52b, and 52c, and the plurality of branch paths 52a to 52c are connected to the plurality of collecting pipes 61a to 61c in the collecting pipe group 6, respectively. Thus, the flow path switching part 5 connects the upper end portion of the exhaust pipe 4 to the plurality of collecting pipes 61a to 61c.

In the present preferred embodiment, the branch path 52a is connected to the collecting pipe 61a for the acid exhaust, the branch path 52b is connected to the collecting pipe 61b for the organic exhaust, and the branch path 52c is connected to the collecting pipe 61c for the alkaline exhaust. Inside the plurality of branch paths 52a to 52c, the plurality of exhaust on-off valves 53a to 53c are provided, respectively. The exhaust on-off valves 53a to 53c are, for example, butterfly valves. The exhaust on-off valves 53a to 53c may be other kinds of valves. Each of the exhaust on-off valves 53a to 53c is connected to an air cylinder or an actuator of a motor or the like (not shown), and respective flow paths of the branch paths 52a to 52c can be opened and closed by the exhaust on-off valves 53a to 53c, respectively.

The outside air introduction part 7 is disposed opposite to each flow path switching part 5 with the collecting pipe group 6 interposed therebetween and connected to the plurality of collecting pipes 61a to 61c. The outside air introduction part 7 includes a branch pipe 71, a plurality of outside air on-off valves 73a, 73b, and 73c, and a shutter 79. One end of the branch pipe 71 is opened as an outside air introduction port 711. As described later, the outside air introduction port 711 communicates with the plurality of collecting pipes 61a to 61c through the branch pipe 71. The outside air introduction port 711 is provided with the shutter 79. The shutter 79 includes, for example, two plate-like members 791, and the two plate-like members 791 are movable along an opening surface of the outside air introduction port 711. In the shutter 79, by changing the positions of the two plate-like members 791, the opening area of the outside air introduction port 711 can be changed.

The other end of the branch pipe 71 branches into a plurality of branch paths 72a, 72b, and 72c, and the plurality of branch paths 72a to 72c are connected to the plurality of collecting pipes 61a to 61c in the collecting pipe group 6, respectively. Specifically, the branch path 72a is connected to the collecting pipe 61a for the acid exhaust, the branch path 72b is connected to the collecting pipe 61b for the organic exhaust, and the branch path 72c is connected to the collecting pipe 61c for the alkaline exhaust. Inside the plurality of branch paths 72a to 72c, the plurality of outside air on-off valves 73a to 73c are provided, respectively. The outside air on-off valves 73a to 73c are, for example, butterfly valves. The outside air on-off valves 73a to 73c may be other kinds of valves. Each of the outside air on-off valves 73a to 73c is connected to an air cylinder or an actuator of a motor or the like (not shown), and respective flow paths of the branch paths 72a to 72c can be opened and closed by the outside air on-off valves 73a to 73c, respectively.

In the substrate processing apparatus 1, in accordance with the processing fluid used in each processing part 31, the flow path switching part 5 and the outside air introduction part 7 corresponding to the processing part 31 are controlled by the control part 10. Specifically, when the acid chemical liquid is used in the processing part 31 to which each flow path switching part 5 is connected, the exhaust on-off valve 53a in the branch path 52a is opened and the other exhaust on-off valves 53b and 53c are closed. The acid exhaust from the processing part 31 is thereby guided to the collecting pipe 61a for the acid exhaust and is not guided to the other collecting pipes 61b and 61c. At that time, the outside air on-off valve 73a in the branch path 72a of the outside air introduction part 7 is closed and the other outside air on-off valves 73b and 73c are opened. Outside air is thereby guided through the branch paths 72b and 72c to the collecting pipe 61b for the organic exhaust and the collecting pipe 61c for the alkaline exhaust.

Further, when the organic solvent is used in the processing part 31, the exhaust on-off valve 53b in the branch path 52b is opened and the other exhaust on-off valves 53a and 53c are closed. The organic exhaust from the processing part 31 is thereby guided to the collecting pipe 61b for the organic exhaust and is not guided to the other collecting pipes 61a and 61c. At that time, the outside air on-off valve 73b in the branch path 72b of the outside air introduction part 7 is closed and the other outside air on-off valves 73a and 73c are opened. Outside air is thereby guided through the branch paths 72a and 72c to the collecting pipe 61a for the acid exhaust and the collecting pipe 61c for the alkaline exhaust.

Furthermore, when the alkaline chemical liquid is used in the processing part 31, the exhaust on-off valve 53c in the branch path 52c is opened and the other exhaust on-off valves 53a and 53b are closed. The alkaline exhaust from the processing part 31 is thereby guided to the collecting pipe 61c for the alkaline exhaust and is not guided to the other collecting pipes 61a and 61b. At that time, the outside air on-off valve 73c in the branch path 72c of the outside air introduction part 7 is closed and the other outside air on-off valves 73a and 73b are opened. Outside air is thereby guided through the branch paths 72a and 72b to the collecting pipe 61a for the acid exhaust and the collecting pipe 61b for the organic exhaust.

Thus, in each flow path switching part 5, the flow path of exhaust gas flowing in the exhaust pipe 4 is switched among the plurality of collecting pipes 61a to 61c. Further, in the outside air introduction part 7 corresponding to the flow path switching part 5, outside air is guided to the collecting pipes other than the collecting pipe selected as the flow path of exhaust gas by the flow path switching part 5. In each outside air introduction part 7, the opening area of the outside air introduction port 711 is adjusted in advance by using the shutter 79 so that the flow rate of the outside air introduced into each of the collecting pipes 61a to 61c may be approximate to that of the exhaust gas in the case where the exhaust gas is introduced into only the corresponding one of the collecting pipes 61a to 61c. The flow rate of gas flowing into each of the collecting pipes 61a to 61c can be thereby always kept almost constant, and the pressure variation in the collecting pipes 61a to 61c can be suppressed.

Figure 6:
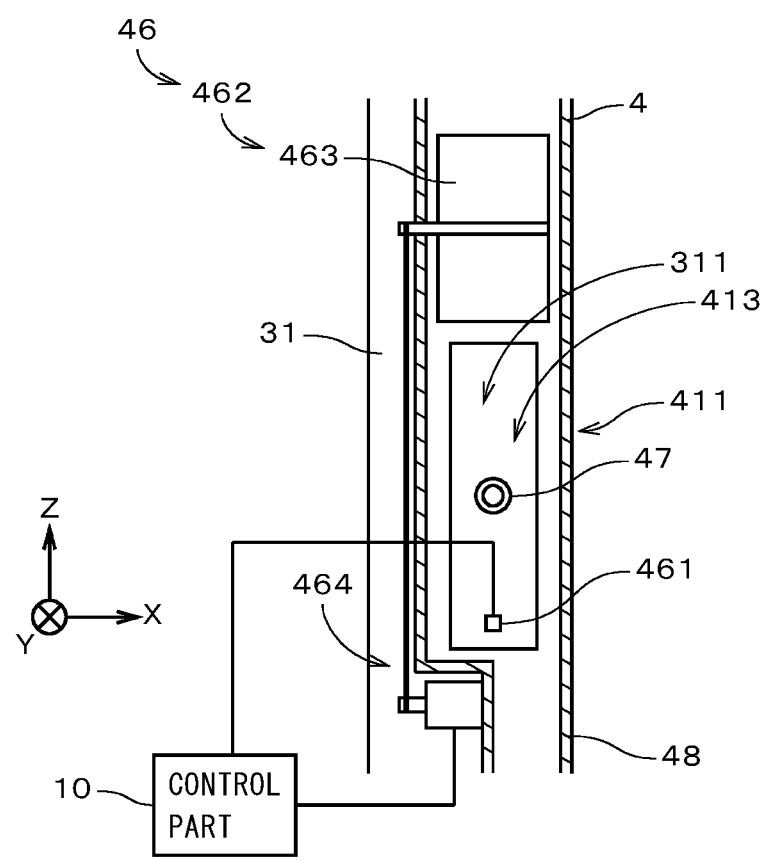
FIG. 6 is a view showing an internal configuration of the vicinity of a lower end portion of an exhaust pipe.

FIG. 6 is a view showing an internal configuration of the vicinity of the lower end portion 411 of the exhaust pipe 4. In the processing chamber of the processing part 31, a long hole 311 extending in the up-and-down direction is formed in a surface oriented toward the Y direction. Also in the lower end portion 411 of the exhaust pipe 4 extending in the up-and-down direction, a long hole 413 extending in the up-and-down direction is formed. The exhaust pipe 4 is attached to the processing part 31 so that the long hole 311 of the processing part 31 and the long hole 413 of the exhaust pipe 4 may overlap each other. Thus, by connecting the processing part 31 and the exhaust pipe 4 through the long holes 311 and 413, it is possible to increase the flow path area in a connection portion between the processing part 31 and the exhaust pipe 4 and reduce the pressure loss.

The substrate processing apparatus 1 further includes a plurality of pressure adjustment parts 46, a plurality of liquid jet parts 47, and a plurality of drain pipes 48. The pressure adjustment part 46 and the drain pipe 48 are disposed at the lower end portion 411 of each exhaust pipe 4, i.e., in a region adjacent to an exhaust outlet (long hole 311) of the processing part 31. The liquid jet part 47 is provided in the vicinity of the long hole 311 inside each processing part 31. The pressure adjustment part 46 includes a pressure sensor 461 and a flow rate adjustment mechanism 462. The flow rate adjustment mechanism 462 includes a damper 463 and an opening adjustment part 464. The damper 463 is provided inside the exhaust pipe 4 above the long hole 413. The opening adjustment part 464 has, for example, a motor and changes the degree of opening of the damper 463. The pressure sensor 461 is provided in the vicinity of the long hole 413 inside the exhaust pipe 4 and measures the pressure inside the exhaust pipe 4. A measured value of the pressure sensor 461 is inputted to the control part 10. The control part 10 uses the opening adjustment part 464 to adjust the degree of opening of the damper 463 so that the measured value of the pressure sensor 461 may be constant, having a predetermined value. Thus, the flow rate of the exhaust gas flowing in the exhaust pipe 4 is adjusted on the basis of the measured value of the pressure sensor 461 by the flow rate adjustment mechanism 462.

The drain pipe 48 extends downward from the lower end portion 411 of the exhaust pipe 4. The drain pipe 48 is connected to a drain facility through the factory plumbing. As described earlier, the liquid jet part 47 is provided in the vicinity of the long hole 311 in the processing part 31. The liquid jet part 47 is a nozzle part for jetting a predetermined liquid into the exhaust pipe 4. In the present preferred embodiment, pure water is jetted from the liquid jet part 47. Microscopic crystals and the like generated from a chemical liquid or the like and contained in the exhaust gas are thereby caught by the jetted pure water and discharged to the drain facility through the drain pipe 48 together with the pure water. Thus, the microscopic crystals and the like contained in the exhaust gas are separated from the exhaust gas by the pure water from the liquid jet part 47. In the liquid jet part 47, a liquid other than pure water may be used.

Figure 7:
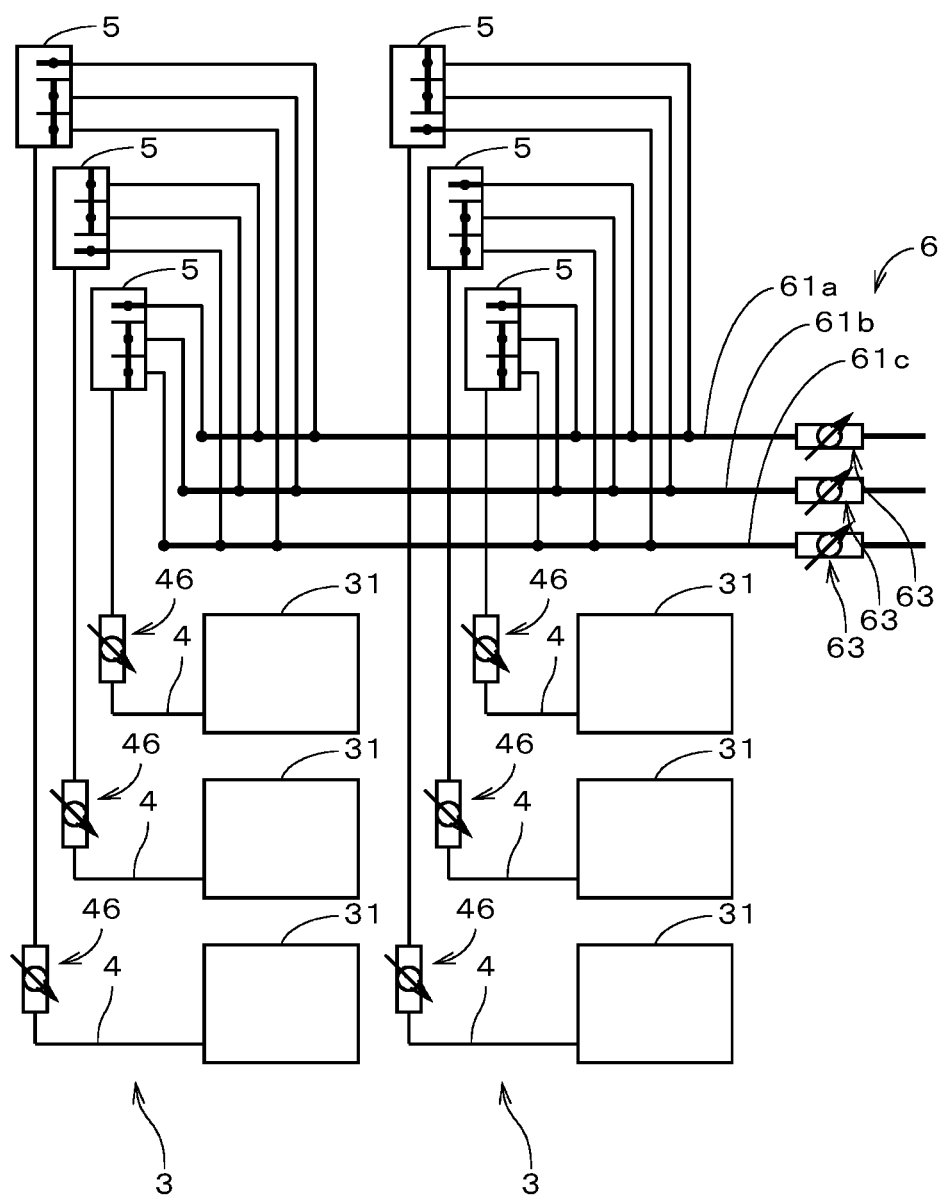
FIG. 7 is a view showing a plurality of multilayer units connected to a collecting pipe group.

FIG. 7 is a view schematically showing the plurality of multilayer units 3 connected to one collecting pipe group 6. In FIG. 7, the plurality of collecting pipes 61*a* to 61*c* in the collecting pipe group 6 are represented by heavy solid line. As shown in FIGS. 1 and 7, each processing part 31 included in one multilayer unit 3 is connected to the plurality of collecting pipes 61*a* to 61*c* through the exhaust pipe 4 and the flow path switching part 5. Further, with respect to one multilayer unit 3, the other multilayer units 3 are positioned in the longitudinal direction (Y direction) of the collecting pipes 61*a* to 61*c*, and each of the processing parts 31 included in the other multilayer units 3 is connected to the plurality of collecting pipes 61*a* to 61*c* through the exhaust pipe 4 and the flow path switching part 5. Thus, to the plurality of collecting pipes 61*a* to 61*c* in each collecting pipe group 6, connected are the plurality of multilayer units 3 which have the same configuration.

In the present preferred embodiment, a pressure adjustment part 63 having the same configuration as that of the already-described pressure adjustment part 46 provided in the exhaust pipe 4 is provided in each of the collecting pipes 61*a* to 61*c* as shown in FIG. 7. Even in a case where the pressure in the factory plumbing is varied by influences or the like of the other apparatuses connected to the factory plumbing, variation of the pressure (the pressure on the side of the multilayer unit 3 rather than the pressure adjustment part 63) inside each of the collecting pipes 61*a* to 61*c* decompressed through the factory plumbing is suppressed.

Further, as described earlier, the outside air introduction part 7 (not shown in FIG. 7) is provided for each flow path switching part 5, and outside air is introduced by the outside air introduction part 7 into the collecting pipe which is not selected as the flow path of the exhaust gas by the flow path switching part 5. It thereby becomes possible to keep the flow rate of gas flowing in each of the collecting pipes 61*a* to 61*c* almost constant and suppress the pressure in the collecting pipes 61*a* to 61*c* from being varied depending on the processing details performed in the plurality of processing parts 31 connected to the collecting pipes 61*a* to 61*c*. Further, it becomes possible to always keep the pressure in the vicinity of the long hole 311 which is an exhaust outlet of the processing part 31 almost constant, since the pressure adjustment part 46 is provided in each exhaust pipe 4 in addition to suppression of the variation of the pressure in the collecting pipes 61*a* to 61*c*. As a result, it is possible to make the condition on the pressure in each processing part 31 temporally constant and make the conditions on the pressures among the plurality of processing parts 31 constant.

In the case where the exhaust switching apparatus for each processing part is disposed in the subfab, like in the apparatus disclosed in Japanese Patent Application Laid-Open No. 2016-72480 (Document 1), since the length of the exhaust pipe connecting from the processing part to the exhaust switching apparatus becomes longer, the pressure loss in the exhaust pipe disadvantageously increases. Further, depending on the arrangement of the exhaust switching apparatus, the lengths and the routes of the plurality of exhaust pipes are different from one another and the conditions on the pressures in the plurality of processing parts connected to the plurality of exhaust pipes sometimes vary. In this case, a significant difference arises in the processing results in the plurality of processing parts. Though there is a possible case where the exhaust switching apparatus is disposed on the side of the processing part and the length of the exhaust pipe is made shorter, the footprint of the substrate processing apparatus on the whole disadvantageously increases. Further, in a case where the number of processing parts increases, since the number of exhaust switching apparatuses to be needed also increases, the footprint of the substrate processing apparatus on the whole further increases (the same applies to the case where the exhaust switching apparatus is disposed in the subfab).

On the other hand, in the substrate processing apparatus 1, the plurality of collecting pipes 61*a* to 61*c* are disposed upper than the plurality of processing parts 31 arrayed in the up-and-down direction. Further, the plurality of exhaust pipes 4 are attached, extending upward from the plurality of processing parts 31. Then, the flow path switching part 5 is provided at the upper end portion of each exhaust pipe 4 and the flow path of the exhaust gas flowing in the exhaust pipe 4 is switched among the plurality of collecting pipes 61*a* to 61*c*. Thus, by disposing the flow path switching part 5 in the vicinity of the processing part 31, it is possible to reduce the length of the exhaust pipe 4 and reduce the pressure loss in the exhaust pipe 4, as compared with the case where the exhaust switching apparatus is disposed in the subfab. Further, it is possible to reduce the variation in the conditions on the pressures in the plurality of processing parts 31 and suppress the difference in the processing results from arising in the plurality of processing parts 31.

In the substrate processing apparatus 1, by disposing the plurality of collecting pipes 61*a* to 61*c* and the plurality of flow path switching parts 5 in the upper portion (ceiling portion), it is possible to reduce the footprint of the substrate processing apparatus 1, as compared with the case where the exhaust switching apparatus is disposed on the side of the processing part. Further, even in the case where the number of processing parts increases, it is possible to suppress the increase of the footprint. Furthermore, it becomes easier to make a design in which the collecting pipes 61*a* to 61*c* and the flow path switching parts 5 are not covered with any other structure, and in this case, it is possible to easily perform maintenance or the like of the collecting pipes 61a to 61c and the flow path switching parts 5. In the substrate processing apparatus 1 of FIG. 1, like the processing parts 31, the collecting pipes 61a to 61c are also fixed to the support frame 20, and the configuration in which the collecting pipes 61a to 61c, the flow path switching parts 5, and the processing parts 31 are provided as one unit is achieved.

In each exhaust pipe 4, provided are the first exhaust path 41 extending upward from the processing part 31 and the second exhaust path 42 connected to the upper end of the first exhaust path 41. The second exhaust path 42 has a portion extending in a direction substantially perpendicular to the up-and-down direction from the upper end of the first exhaust path 41 and is connected to the flow path switching part 5. In each combination of two exhaust pipes 4 included in the plurality of exhaust pipes 4 in each multilayer unit 3, the length of the first exhaust path 41 in one exhaust pipe 4 is longer than that of the first exhaust path 41 in the other exhaust pipe 4, and the length of the second exhaust path 42 in one exhaust pipe 4 is shorter than that of the second exhaust path 42 in the other exhaust pipe 4. In the plurality of exhaust pipes 4 included in the same multilayer unit 3, it thereby becomes possible to reduce the difference in the pressure loss.

In the substrate processing apparatus 1, further provided are the liquid jet part 47 for jetting a predetermined liquid into the exhaust pipe 4 and the drain pipe 48 extending downward from the lower end portion 411 of the exhaust pipe 4. The microscopic crystals and the like contained in the exhaust gas are thereby caught by the liquid jetted from the liquid jet part 47 and discharged to the drain facility through the drain pipe 48 together with the liquid. It is thereby possible to suppress an increase in the pressure loss caused by deposition of the crystals and the like on inner surfaces of the exhaust pipe 4 and the like.

Herein, if an exhaust pipe extending downward from the processing part 31 is provided, the liquid jetted from the liquid jet part 47 moves in the exhaust pipe and goes downward. In this case, at some midpoint in the exhaust pipe, provided is a collection tank for collecting the liquid. In such a configuration, depending on the amount of liquid in the collection tank, the pressure in the vicinity of the exhaust outlet of the processing part 31 varies. On the other hand, in the substrate processing apparatus 1, since the exhaust pipe 4 extending upward from the processing part 31 is provided, it is possible to prevent the pressure variation depending on the amount of liquid in the collection tank in the above-described configuration.

In the above-described substrate processing apparatus 1, various modifications can be made.

Figure 8:
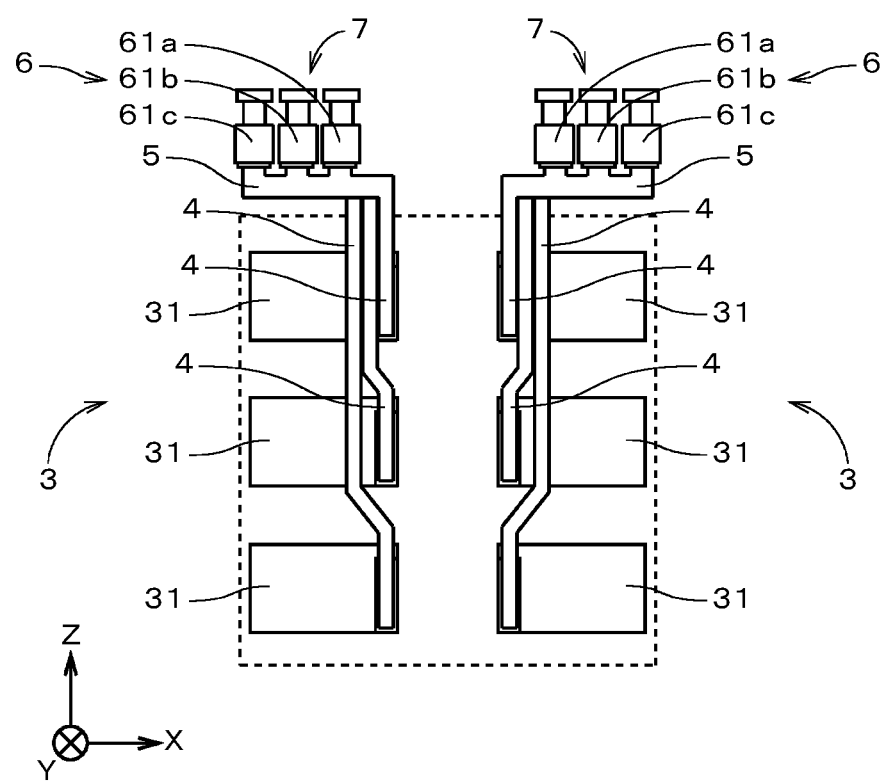
FIG. 8 is a view showing another array of a plurality of collecting pipes.

While the plurality of collecting pipes 61a to 61c in each collecting pipe group 6 are arrayed in the up-and-down direction in the present preferred embodiment, the plurality of collecting pipes 61a to 61c may be arrayed in a direction (X direction) perpendicular to the longitudinal direction and the up-and-down direction, as shown in FIG. 8. Also in this case, since the plurality of collecting pipes 61a to 61c overlap the plurality of processing parts 31 in the up-and-down direction, it is possible to prevent the intake of air in the fan filter unit provided above the center robot 23 (see FIG. 2) from being blocked by the collecting pipes 61a to 61c.

Further, in each collecting pipe group 6, only two collecting pipes may be provided. In this case, as an example, one collecting pipe is used for the acid exhaust and the other collecting pipe is used for the alkaline exhaust. In another exemplar case, one collecting pipe is used for the acid exhaust and the other collecting pipe is used for the organic exhaust. Furthermore, in each collecting pipe group 6, four or more collecting pipes may be provided, and in this case, a plurality of kinds of processing fluids which are suppliable in the processing part 31 are classified into four or more fluid classifications. Thus, in the substrate processing apparatus 1, two or more collecting pipes have only to be provided, corresponding to two or more fluid classifications into which the plurality of kinds of processing fluids are classified. Furthermore, the number of exhaust on-off valves in each flow path switching part 5 and the number of outside air on-off valves in each outside air introduction part 7 are the same as that of the above-described two or more collecting pipes.

In the pressure adjustment part 46 of FIG. 6 provided in each exhaust pipe 4, by changing the degree of opening of the damper 463, the flow rate of the exhaust gas flowing in the exhaust pipe 4 is adjusted, but for example, the pressure adjustment part 46 may be achieved by using a blower fan as the flow rate adjustment mechanism. In this case, by changing the number of rotations of the blower fan on the basis of the measured value of the pressure sensor 461, the flow rate of the exhaust gas flowing in the exhaust pipe 4 is adjusted. Also in the pressure adjustment part 63 (see FIG. 7) provided in each of the collecting pipes 61a to 61c, similarly, the blower fan may be used.

In the outside air introduction part 7 of FIG. 5, a plurality of pipes which are independent from one another may be provided, instead of the plurality of branch paths 72a to 72c (branch pipe 71). In this case, there may be a configuration where the plurality of outside air introduction ports 711 are provided at the end portions of the plurality of pipes, respectively, on the side opposite to the plurality of collecting pipes 61a to 61c, and the shutter 79 is attached to each of the outside air introduction ports 711. It thereby becomes possible to adjust the flow rate of the introduced outside air for each of the collecting pipes 61a to 61c with high accuracy.

Depending on the design of the substrate processing apparatus 1, the outside air introduction part 7 in each multilayer unit 3 may be omitted. The multilayer unit 3 has only to include at least a set of the plurality of processing parts 31, the plurality of exhaust pipes 4, and the plurality of flow path switching parts 5.

The substrate to be processed in the substrate processing apparatus 1 is not limited to a semiconductor substrate, but may be a glass substrate or any other substrate.

The configurations in the above-discussed preferred embodiment and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention.

REFERENCE SIGNS LIST

1 Substrate processing apparatus
3 Multilayer unit
4 Exhaust pipe
5 Flow path switching part
7 Outside air introduction part
9 Substrate
10 Control part
20 Support frame
31 Processing part 41 First exhaust path
42 Second exhaust path
46 Pressure adjustment part
47 Liquid jet part
48 Drain pipe
53a to 53c Exhaust on-off valve
61a to 61c Collecting pipe
73a to 73c Outside air on-off valve
79 Shutter
311 Long hole (of processing part)
411 Lower end portion (of exhaust pipe)
412 Upper end (of first exhaust path)
461 Pressure sensor
462 Flow rate adjustment mechanism
711 Outside air introduction port

The invention claimed is:

1. A substrate processing apparatus, comprising:
a plurality of processing parts arrayed in an up-and-down direction, each of which is capable of supplying a plurality of kinds of processing fluids to a substrate;
a plurality of exhaust pipes extending upward from said plurality of processing parts, into which exhaust gases from said plurality of processing parts flow, respectively, each of said plurality of exhaust pipes having an upper end portion and a lower end portion;
two or more collecting pipes arranged above said plurality of processing parts, said two or more collecting pipes corresponding to two or more fluid classifications, respectively, into which said plurality of kinds of processing fluids are classified;
a plurality of flow path switching parts which are provided at the upper end portions of said plurality of exhaust pipes, respectively, each of said plurality of flow path switching parts connecting said upper end portion to said two or more collecting pipes and switching a flow path of exhaust gas flowing in said exhaust pipe, among said two or more collecting pipes;
a control part for controlling said plurality of flow path switching parts in accordance with the processing fluids used in said plurality of processing parts; and
a fan filter unit provided above said plurality of processing parts and below said two or more collecting pipes, wherein
said two or more collecting pipes overlap said plurality of processing parts in said up-and-down direction while being stacked in said up-and-down direction, and an intake of air in said fan filter unit is thereby prevented from being blocked by said two or more collecting pipes.

2. The substrate processing apparatus according to claim 1, further comprising:
a support frame for supporting said plurality of processing parts,
wherein said two or more collecting pipes are fixed to said support frame.

3. The substrate processing apparatus according to claim 1, wherein
said two or more collecting pipes extend in a longitudinal direction perpendicular to said up-and-down direction,
said substrate processing apparatus, in which a set of said plurality of processing parts, said plurality of exhaust pipes, and said plurality of flow path switching parts is assumed as a multilayer unit, further comprising:
another multilayer unit having the same constitution as that of said multilayer unit and being positioned in said longitudinal direction with respect to said multilayer unit.

4. The substrate processing apparatus according to claim 1, wherein
each exhaust pipe comprises:
a first exhaust path extending upward from a processing part; and
a second exhaust path having a portion extending from an upper end of said first exhaust path toward a direction perpendicular to said up-and-down direction and being connected to a flow path switching part,
respective upper ends of a plurality of first exhaust paths in said plurality of exhaust pipes are aligned in a direction perpendicular to said up-and-down direction,
respective lengths of said plurality of first exhaust paths are different from one another, and
respective lengths of a plurality of second exhaust paths in said plurality of exhaust pipes are different from one another.

5. The substrate processing apparatus according to claim 1, wherein
each processing part is connected to an exhaust pipe extending in said up-and-down direction through a long hole extending in said up-and-down direction.

6. The substrate processing apparatus according to claim 1, further comprising:
a plurality of liquid jet parts for jetting a predetermined liquid into said plurality of exhaust pipes, respectively; and
a plurality of drain pipes extending downward from respective lower end portions of said plurality of exhaust pipes.

7. The substrate processing apparatus according to claim 1, further comprising:
a plurality of pressure adjustment parts provided in said plurality of exhaust pipes, respectively,
wherein each pressure adjustment part comprises:
a pressure sensor for measuring pressure in an exhaust pipe; and
a flow rate adjustment mechanism for adjusting a flow rate of said exhaust gas flowing in said exhaust pipe on the basis of a measured value of said pressure sensor.

8. The substrate processing apparatus according to claim 7, wherein
said each pressure adjustment part is disposed at a lower end portion of said exhaust pipe.

9. The substrate processing apparatus according to claim 1, further comprising:
a plurality of outside air introduction parts each of which is connected to said two or more collecting pipes, said plurality of outside air introduction parts corresponding to said plurality of flow path switching parts, respectively,
wherein an outside air introduction part corresponding to each flow path switching part introduces outside air into a collecting pipe(s) other than the collecting pipe selected as said flow path of exhaust gas by said each flow path switching part.

10. The substrate processing apparatus according to claim 9, wherein
each outside air introduction part has a shutter for changing an opening area of an outside air introduction port communicating with said two or more collecting pipes.

11. A substrate processing apparatus, comprising:
a plurality of processing parts arrayed in an up-and-down direction, each of which is capable of supplying a plurality of kinds of processing fluids to a substrate;
a plurality of exhaust pipes extending upward from said plurality of processing parts, into which exhaust gases from said plurality of processing parts flow, respectively, each of said plurality of exhaust pipes having an upper end portion and a lower end portion;

two or more collecting pipes arranged above said plurality of processing parts, said two or more collecting pipes corresponding to two or more fluid classifications, respectively, into which said plurality of kinds of processing fluids are classified;

a plurality of flow path switching parts which are provided at the upper end portions of said plurality of exhaust pipes, respectively, each of said plurality of flow path switching parts connecting said upper end portion to said two or more collecting pipes and switching a flow path of exhaust gas flowing in said exhaust pipe, among said two or more collecting pipes;

a plurality of outside air introduction parts each of which is connected to said two or more collecting pipes, said plurality of outside air introduction parts corresponding to said plurality of flow path switching parts, respectively; and a control part for controlling said plurality of flow path switching parts in accordance with the processing fluids used in said plurality of processing parts, wherein said two or more collecting pipes overlap said plurality of processing parts in said up-and-down direction while being stacked in said up-and-down direction, and said plurality of flow path switching parts are connected to one lateral side of said two or more collecting pipes, and said plurality of outside air introduction parts are connected to the other lateral side of said two or more collecting pipes so that said plurality of outside air introduction parts are disposed opposite to said plurality of flow path switching parts with said two or more collecting pipes interposed therebetween.

12. The substrate processing apparatus according to claim 11, wherein
each of said plurality of flow path switching parts includes two or more exhaust on-off valves,
each of said plurality of outside air introduction parts includes two or more outside air on-off valves, and
said two or more exhaust on-off valves and said two or more outside air on-off valves are opposite to each other with said two or more collecting pipes interposed therebetween.

13. The substrate processing apparatus according to claim 11, further comprising:
a support frame for supporting said plurality of processing parts,
wherein said two or more collecting pipes are fixed to said support frame.

14. The substrate processing apparatus according to claim 11, wherein
said two or more collecting pipes extend in a longitudinal direction perpendicular to said up-and-down direction,
said substrate processing apparatus, in which a set of said plurality of processing parts, said plurality of exhaust pipes, and said plurality of flow path switching parts is assumed as a multilayer unit, further comprising:

another multilayer unit having the same constitution as that of said multilayer unit and being positioned in said longitudinal direction with respect to said multilayer unit.

15. The substrate processing apparatus according to claim 11, wherein
each exhaust pipe comprises:
a first exhaust path extending upward from a processing part; and
a second exhaust path having a portion extending from an upper end of said first exhaust path toward a direction perpendicular to said up-and-down direction and being connected to a flow path switching part,
respective upper ends of a plurality of first exhaust paths in said plurality of exhaust pipes are aligned in a direction perpendicular to said up-and-down direction,
respective lengths of said plurality of first exhaust paths are different from one another, and
respective lengths of a plurality of second exhaust paths in said plurality of exhaust pipes are different from one another.

16. The substrate processing apparatus according to claim 11, wherein
each processing part is connected to an exhaust pipe extending in said up-and-down direction through a long hole extending in said up-and-down direction.

17. The substrate processing apparatus according to claim 11, further comprising:
a plurality of liquid jet parts for jetting a predetermined liquid into said plurality of exhaust pipes, respectively; and
a plurality of drain pipes extending downward from respective lower end portions of said plurality of exhaust pipes.

18. The substrate processing apparatus according to claim 11, further comprising:
a plurality of pressure adjustment parts provided in said plurality of exhaust pipes, respectively,
wherein each pressure adjustment part comprises:
a pressure sensor for measuring pressure in an exhaust pipe; and
a flow rate adjustment mechanism for adjusting a flow rate of said exhaust gas flowing in said exhaust pipe on the basis of a measured value of said pressure sensor.

19. The substrate processing apparatus according to claim 18, wherein
said each pressure adjustment part is disposed at a lower end portion of said exhaust pipe.

20. The substrate processing apparatus according to claim 11, wherein
an outside air introduction part corresponding to each flow path switching part introduces outside air into a collecting pipe(s) other than the collecting pipe selected as said flow path of exhaust gas by said each flow path switching part.

* * * * *